(12) United States Patent
Dawson et al.

(10) Patent No.: US 7,598,149 B2
(45) Date of Patent: Oct. 6, 2009

(54) MICRO-LEDS

(75) Inventors: Martin David Dawson, Bishopton (GB); Hoi Wai Choi, Glasgow (GB); Chan-Wook Jeon, Glasgow (GB)

(73) Assignee: University of Strathclyde, Glasgow (GB)

( * ) Notice: Subject to any disclaimer, the term of this patent is extended or adjusted under 35 U.S.C. 154(b) by 246 days.

(21) Appl. No.: 10/544,002

(22) PCT Filed: Feb. 2, 2004

(86) PCT No.: PCT/GB2004/000360

§ 371 (c)(1), (2), (4) Date: Jul. 29, 2005

(87) PCT Pub. No.: WO2004/070844

PCT Pub. Date: Aug. 19, 2004

(65) Prior Publication Data

US 2006/0110839 A1 May 25, 2006

(30) Foreign Application Priority Data

Feb. 5, 2003 (GB) .................. 0302580.6

(51) Int. Cl.
*H01L 21/331* (2006.01)
(52) U.S. Cl. .................. 438/343; 257/E21.377
(58) Field of Classification Search .............. 438/164, 438/328, 343, 412; 257/E21.377
See application file for complete search history.

(56) References Cited

U.S. PATENT DOCUMENTS

| 5,202,286 | A | 4/1993 | Nakatani |
| 5,501,990 | A | 3/1996 | Holm et al. |
| 6,229,160 | B1 | 5/2001 | Krames et al. |
| 7,160,747 | B2 * | 1/2007 | Haberern et al. ............. 438/39 |
| 2002/0137236 | A1 * | 9/2002 | Schaff et al. ................ 438/12 |
| 2003/0010989 | A1 | 1/2003 | Yukimoto |
| 2003/0231683 | A1 * | 12/2003 | Chua et al. .................. 372/46 |

FOREIGN PATENT DOCUMENTS

DE 196 31 907 2/1998
EP 1 256 987 11/2002

OTHER PUBLICATIONS

I. Ozden, M. Diagne, A.V. Nurmikko, J. Han and T. Takeuchi; *A Matrix Addressable 1024 Element Blue Light Emitting InGaN QW Diode Array*; Phys. Stat. Sol; 2001; pp. 139-142; vol. 188, No. 1 (XP-002283111).

H.X. Jiang, S.X. Jin, J. Li, J. Shakya and J.Y Lin; *III-nitride blue microdisplays*; Applied Physics Letters; Feb. 26, 2001; pp. 1303-1305; vol. 78, No. 9.

(Continued)

*Primary Examiner*—Charles D. Garber
*Assistant Examiner*—Elias Ullah
(74) *Attorney, Agent, or Firm*—Alston & Bird LLP (57) ABSTRACT

An array of light emitting devices, each device comprising a sloped wall mesa (24) of luminescent semiconductor material. Extending over the sloped wall mesas (24) is a metal contact (30). The array can be arranged as a parallel addressable system so that all devices (24) can be stimulated to emit light simultaneously. Alternatively, the array can be arranged as a matrix addressable array, in which case individual devices can be selectively stimulated.

13 Claims, 6 Drawing Sheets

OTHER PUBLICATIONS

Kent M. Geib, Kent D. Choquette, Darwin K. Serkland, Andrew A. Allerman and Terry W. Hargett; *Fabrication and Performance of Two-Dimensional Matrix Addressable Arrays of Integrated Vertical-Cavity Lasers and Resonant Cavity Photodetectors*; IEEE Journal of Selected Topics in Quantum Electronics; Jul./Aug. 2002; pp. 943-947; vol. 8, No. 4.

Seong-Ran Jeon, Young-Ho Song, Ho-Jin Jang, Gye Mo Yang, Soon Won Hwang and Sung Jin Son; *Lateral current spreading in GaN-based light-emitting diodes utilizing tunnel contact junctions*; Applied Physics Letters; May 21, 2001; pp. 3265-3267; vol. 78, No. 21.

International Search Report for PCT/GB2004/000360 completed Jul. 7, 2004.

* cited by examiner

MICRO-LEDS

BACKGROUND OF THE INVENTION

1) Field of the Invention

The present invention relates to an array of micrometer-sized light emitting devices (i.e. of individual device diameter in the range 1-100 μm, and typically several 10's of μm), such as light emitting diodes (LEDs) or vertical cavity surface emitting lasers (VCSELs), and a method for making such an array. In particular, the present invention relates to an array of surface emitting LEDs based on the III-V semiconductor alloy materials system AlGaInN, deposited as a multi-layer epitaxial thin film structure on a sapphire, silicon carbide or GaN substrate or other suitable substrate known in the art.

2) Description of Related Art

In the ongoing drive towards miniaturisation of opto-electronic devices, there is a desire to fabricate arrays of very small closely spaced LEDs ("micro-LEDs"). However, reducing the dimensions and spacing of LEDs can cause fabrication problems. One particular problem that has been encountered is that of how to reliably make electrical contact to the LED material. For conventional, relatively large-scale devices (where the diameter is typically 100s of microns), a metal contact is usually deposited in a blanket form over the LEDs, thereby directly coating specific areas of the semiconductor device surface where p-type and n-type dopant-containing layers have been exposed for contacting. However, this is difficult at small dimensions and in array formats in which individual devices have to be separately contacted using metal lines that have to be run to such devices from remote contact pads. Such metal lines traverse the semiconductor surface between individual device elements and make contact thereto. Because the semiconductor surface is typically non-planar due to the etching that is required to electrically isolate devices and to expose n-type and p-type regions for contacting, this can be problematic. This is because the metallisation layers cannot provide satisfactory step-coverage over non-planar surfaces containing sharp edges, which can lead to difficulties with adhesion and to open-circuit cracks or breaks in the metal lines.

In order to make the fabrication of micro-LEDs somewhat more reliable various techniques have been proposed. In one such method, a sacrificial material, such as silicon dioxide, is deposited over the uneven surface between the LED mesas, so that it in-fills the regions between them. This silicon dioxide layer is etched or chemically and/or mechanically polished to expose upper surfaces of the LED material. A metal layer is then deposited over the entire surface, including the exposed areas. In this way, each of the LEDs is metallised. By infilling the gaps between the LEDs with silicon dioxide and then planarising the silicon dioxide, the surface presented during the metallisation stage is relatively flat. This means that metal can be reliably deposited over the surface of the LEDs.

While planarisation can and has been adopted for the fabrication of GaN-based LEDs, it is not without drawbacks. One problem is that voids can be created in the in-fill material that is used between the LED mesas. When the in-fill material is subsequently planarised, these voids can result in a pitted, non-uniform upper surface, which can in turn cause breaks in the metal contact. Furthermore, regardless of whether planarisation is achieved through an etch-back or chemical-mechanical polishing (CMP), damage to the epitaxial layer is inevitable. Where the top layer is p-type GaN, and a p-contact is to be formed on this, this is a particular problem. This is because p-type GaN is very sensitive to damage. This manifests itself in the form of undesirable electrical and optical properties in the fabricated devices. Therefore, the application of planarisation to the GaN material system is far from ideal.

Further issues with forming contacts for arrays of LEDs arise when each LED has to be individually addressable, that is where each LED has to be individually switched on and off. This can be achieved by a true individual addressing scheme, where separate contacting lines run to each device. In this case, the number of lines required for individually-addressing an array of n devices scales as n-squared, which can limit scalability of array size and number of elements. An advantageous method that achieves the same end but with fewer (2n) lines and which is therefore more scalable, is the so-called matrix-addressing scheme. In this, each row and each column of device elements shares a common metal line. When a voltage is applied to a column and a row, this causes illumination of the device that is at the intersection between the row and column.

Many arrangements have been proposed for forming arrays of individually addressable LEDs. Both individual and matrix-addressing schemes for AlGaInN micro-LED devices have been reported. An example of the former is described in the article "III-nitride blue microdisplays" by H. X. Jiang et al., Applied Physics Letters, Vol. 78, No. 9, pp. 1303-1305, 26 Feb. 2001. Examples of the latter are described in the articles "A matrix addressable 1024 element blue light emitting InGaN QW diode array", by I. Ozden et al., Physica Status Solidi (a), Volume 188, No. 1, pp. 139-142 (2001) and "Fabrication and Performance of Two-Dimensional Matrix Addressable Arrays of Integrated Vertical-Cavity Lasers and Resonant Cavity Photodetectors" by Geib et al., IEEE Journal of Selected Topics in Quantum Electronics, Vol. 8, No. 4, July/August 2002. However, all of these prior art arrangements involve processing complications and compromises in performance that are readily apparent to those skilled in the art. The complications and compromises are related to issues of (i) scalability of array size; (ii) simplicity of the metallisation and processing scheme; (iii) optical isolation between devices ("cross-talk"), and (iv) non-optimal electrical and optical performance.

BRIEF SUMMARY OF THE INVENTION

An object of the invention is to overcome at least some of the disadvantages of prior art arrangements.

According to one aspect of the present invention there is provided a method of fabricating an array of light emitting devices using semiconductor material that includes a p-n junction, the method comprising controlling an etch process to define a plurality of sloped-wall mesas in semiconductor material. Preferably, each device is an LED or a VCSEL. Preferably, the semiconductor material is AlGaInN based.

The method preferably further comprises depositing an electrical contact, such as metal, over the sloped-sidewall mesas. Each mesa may be partially covered by the contact. Each mesa may be wholly covered by the contact. At least part of the contact may act as a shadow mask to confine light within the mesa, thereby reducing optical losses and the effects of cross talk.

By providing sloped-sidewall mesas, it is possible to reliably and repeatably metallise the devices. The sloped sidewalls are directly exposed to the metallisation during coating and offer conformal metal coverage without cracks or open-circuit breaks. They can also be used to optically isolate individual devices, and offer improved optical and electrical performance over existing schemes. Furthermore, by providing sloped sidewall mesas, simple processing methodologies for interconnecting and/or matrix addressing the device arrays are provided.

It should be noted that in the art it is widely believed that it is essential to form LEDs and VCSELs with vertical sidewalls. Indeed much research and effort has been devoted to forming LED mesas that have substantially vertical sidewalls. In devising the light emitting devices of the present invention, it has been appreciated that although vertical sidewalls may be critical for the operation of many optical devices, other photonic devices such as light-emitting diodes and vertical cavity surface emitting lasers do not strictly require vertical sidewalls. This is contrary to well accepted teachings and practice in the art.

Preferably the sidewalls of each individual device are designed to have an inclination of between 20°-40° to the vertical. For mesas having sidewall inclinations in this range, conformal step coverage is possible for structures having a height of up to 5 microns. Each mesa may have one or more sloped sidewall(s).

Preferably, the method further involves defining a lower electrical contact; forming the sloped wall mesas on that lower contact and forming one or more upper contacts on an upper surface of one or more of the mesas.

The upper contact may be in contact with all of the mesas on the lower contact. In this case, by applying an electrical signal between the upper and lower contacts, all of the devices can be simultaneously activated, thereby to emit light.

The upper contact may be in contact with only one of the mesas on the lower contact, in which case, by applying an electrical signal to the lower electrical contact and simultaneously to the upper contact, so that a potential difference is applied across one of the devices, there is provided a simple and effective mechanism for individually addressing one of the LEDs. At the same time, because a plurality of devices is provided directly on a single lower electrode, the device is compact and readily scalable.

The lower contact may comprise n-type semiconductor material. The doping concentrations in the n-type material may be of the order of $10^{18}$ per $cm^3$ and above. In this case, the upper contact may comprise a suitable metal, preferably a thin film of metal, physically contacted to exposed p-type material. The n-type material of the lower contact may be formed from a layer of n-type material that defines at least part of the semiconductor mesas.

The lower contact may comprise p-type semiconductor material. The doping concentrations of the p-type material may be of the order of $10^{17}$ per $cm^3$ and above. In this case, the upper contact may comprise a suitable metal thin film physically contacted to exposed n-type material. Also, for this example, the p-type material of the lower contact may be formed from a layer of p-type material that defines at least part of the semiconductor mesas.

A plurality of lower contacts may be formed, each carrying a plurality of semiconductor mesas. In this case, each of the plurality of lower contacts is isolated from the upper contacts. One or more of the upper contacts may extend over one or more of the lower contacts. Thin films of Ti/Al and Ni/Au, respectively, are representative contact metallisations for n-type and p-type GaN structures. Where these films cover substantially all of the upper surface of each mesa, they are preferably of a thickness that is sufficient to allow light emitted from the semiconductor material to be transmitted therethrough.

To avoid or reduce the effects of crosstalk, the sloped sidewalls of the mesas may be clad with a blocking material. This may comprise a relatively thick layer of metal that is sufficient to block light. For example, the cladding material may comprise 20 nm of nickel and 200 nm of gold.

The, or each, lower contact may be substantially elongate and may carry a row of semiconductor mesas.

The, or each, upper contact may be substantially elongate and extend over a mesa carried on each of the lower contacts. The, or each, upper contact may comprise a strip of metal.

The upper and lower contacts may be separated and electrically isolated from each other by insulating material.

The lower and upper contacts may extend substantially perpendicular to each other.

Preferably, the method involves using a starting material that comprises a substrate, for example sapphire, on which is deposited a first semiconductor material having a first carrier type and then a second semiconductor material having a second carrier type. Between the two types of semiconductor material may be provided an active region comprising a multi-quantum well, for example, an InGaN/GaN multi-quantum well. The step of defining a lower electrical contact may comprise forming one or more trenches in the first semiconductor material, thereby to define a lower contact mesa that is isolated from other regions of the first semiconductor material. The step of forming one or more trenches may involve etching the semiconductor material.

The step of etching may comprise controlling the etch process so that it defines a lower contact mesa that has one or more sloped sidewall(s). The step of forming a plurality of semiconductor mesas on the lower contact may comprise selectively etching an upper surface of the lower contact mesa. The step of selectively etching comprises controlling the etch process thereby to define semiconductor mesas having sloped sidewalls. The step of controlling may comprise selecting one or more parameters to ensure that sloped sidewalls are defined. The angle of inclination of the sloped wall of the lower contact may be different to, preferably less than, that of the semiconductor mesas.

The method may further involve selectively depositing insulating material, for example silicon dioxide, over the semiconductor mesas so as cover all areas except pre-determined areas above the semiconductor mesas, and then depositing the upper contacts over the semiconductor mesas. By depositing the upper contacts over insulating material in regions away from the tops of the semiconductor mesas, this ensures that the upper contacts are electrically isolated from each other.

According to another aspect of the present invention there is provided an array of light emitting devices, each device comprising a sloped wall mesa of semiconductor material that includes a p-n junction. Each device preferably further comprises an electrical contact, for example a metal contact that extends over the sloped-sidewall mesas and contacts an upper surface thereof. Insulating material, for example silicon dioxide, may be provided between the sloped walls and the electrical contact. Preferably, each device is an LED or a VCSEL. Preferably, each mesa is a dry-etched.

The sidewalls of each individual mesa may have an inclination-of between 20°-40° to the vertical.

The semiconductor material may comprise any AlGaInN alloy multi-layer structure designed for electro-luminescent operation. Preferably, the semiconductor material is provided on a substrate, for example a sapphire substrate. Of course, the substrate could be any other suitable material, such as silicon carbide, gallium nitride, or any other substrate material demonstrated in the art for growth of epitaxial structures, and in particular AlGaInN epitaxial structures.

A typical structure for violet/blue/green emission, known from the art, may consist of a GaN or AlN low temperature grown buffer layer, typically 25-30 nm thick, grown on the substrate. Over this may be provided a layer of silicon doped (n-type) GaN. This may have a thickness in the range of three to four microns. Deposited on the n-type GaN may be a multi-quantum well active region, for example an InGaN/GaN multi-quantum well. The number of quantum wells used may vary according to the device requirements, but is typically in the range of one to six. As is well known in the art, control of the width and composition of the quantum wells allows the electroluminescent wavelength of the device to be determined.

On the multi-quantum well may be provided a p-type GaN layer for use as a p-type contact. This may be doped with Mg and may have a thickness in the range of 0.25 to 0.5 microns. Optionally, a layer of n-type AlGaN may be grown between the n-type GaN and the active region. Likewise, optionally, a layer of p-type AlGaN may be grown between the p-type GaN and the active region.

One or more ridges may be defined in the semiconductor material, each ridge having a sloped sidewall, wherein the sloped sidewall mesas are provided on one or more of the ridges. Preferably, the inclination of the sidewall of any given mesa is greater than the inclination of the sidewall of the ridge on which it is defined. Each ridge may define an electrical contact. Extending over the mesas may be another, upper electrical contact. The upper contact may extend over one or more of the mesas on the ridge. A plurality of upper contacts may be formed. Each upper contact may extend over one mesa on each of the ridges. By applying a potential difference between any given ridge and one of the upper contacts, a selected one of the mesas can be caused to emit light.

Preferably, a cladding layer is provided over the sloped widewalls of the semiconductor mesas, the cladding layer being adapted to prevent light being emitted through the sidewalls. The cladding layer may be formed as part of an electrical contact.

BRIEF DESCRIPTION OF THE SEVERAL VIEWS OF THE DRAWINGS

Various aspects of the invention will now be described by way of example only and with reference to the accompanying drawings, of which.

DETAILED DESCRIPTION OF THE INVENTION

Figure 1A:
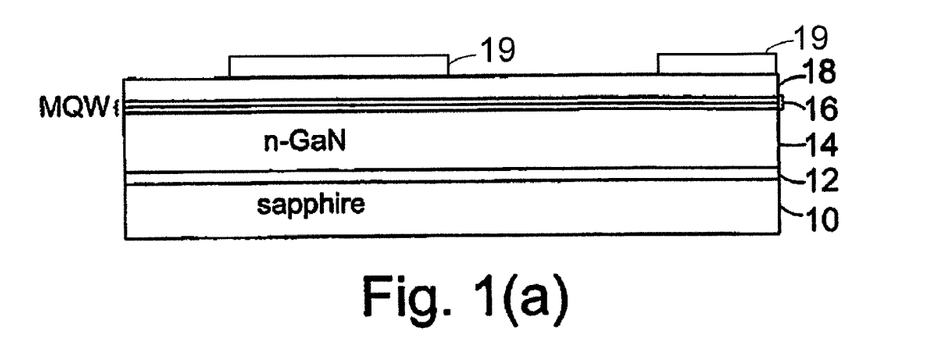
FIGS. 1(a) to (d) show the steps in a method for forming sloped sidewall LEDs.

FIG. 1(a) shows a representative starting material structure for forming an array of GaN-based micro-LEDs. This has a sapphire substrate 10, on which is deposited an n-type GaN or AlN low temperature grown buffer layer 12. This is typically 25-30 nm thick. Grown on the buffer layer 12 is silicon doped GaN. Typically, this has a thickness in the region of 3-4 microns. This is for use as an n-type contact. Deposited on the n-type GaN 14 is an active region, which in this case is a multi-quantum well 16, for example an InGaN/GaN multi-quantum well. The number of quantum wells used may vary according to the device requirements, but is typically in the range of one to six. The emission wavelength of devices fabricated using this material is controlled by the composition and well width of the quantum wells; for example, 2 nm-thick In(0.2)Ga(0.8)N quantum wells emit luminescence near 450 nm. On the multi-quantum well 16 is a p-type GaN layer 18 for use as a p-type contact. This is doped with Mg and has a thickness in the range of 0.25 to 0.5 microns. Optionally, a layer of n-type AlGaN (not shown) may be grown between the n-type GaN 14 and the active region 16. Likewise, optionally, a layer of p-type AlGaN (not shown) may be grown between the p-type GaN 18 and the active region 16.

Arrays of micro-LEDs can be formed in the material of FIG. 1(a) in a variety of ways, although the preferred option is to form arrays of mesas using dry etching processes. This is because GaN based materials tend to be resistant to wet chemical etching. Of the dry etching processes currently available, inductively-coupled plasma (ICP) dry etching has proven to be particularly attractive. This is because of its flexibility in offering isotropic or anisotropic etching by varying the parameters, and because it offers etch rates of up to one micrometer per minute compared to tens of nanometres per second for conventional reactive ion etching. Typically, the etch process should yield high etch rates and selectivities, minimal surface roughening, good reproducibility and a high degree of anisotropy.

Figure 1B:
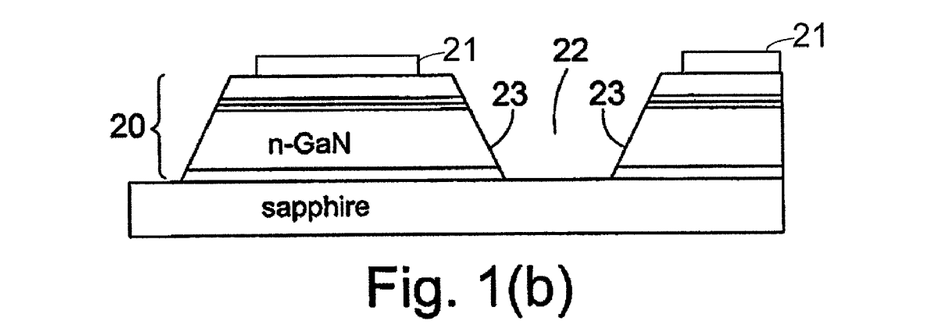

To form an array of micro-LEDs, the material of FIG. 1(a) is patterned using positive photo-resist 19 and then etched to define a series of elongate ridges 20 that are separated by trenches 22. The etch process is set up and controlled to ensure that the ridges 20 have sloped sidewalls 23, as shown in FIG. 1(b). The sloped sidewalls are such that the base of the ridges 20, i.e. the part nearest to the substrate, is wider than the top, i.e. the part that is furthest from the substrate. Etching is continued until all material between adjacent ridges is removed down to the sapphire substrate. This means that each of the ridges is electrically isolated from the other ridges.

In order to form the sloped sidewalls 23 isotropic etching is needed. This requires a vertical and lateral etch component. As noted above, the ICP system is particularly suited for this purpose. One reason for this is that ICP etching allows for the variation of a multitude of parameters, several of which are independently controllable. The most important parameters for controlling the profile are the pressure and the correct combination of ICP and RIE powers. This yields a certain d.c. self bias, which is important to determine the gradient. In general, a lower d.c. self bias gives sidewalls with a greater inclination angle to the vertical. On the other hand, a lower etch rate is expected due to a reduced sputtering component in the etch process.

A variety of process recipes can be tailored to meet the specifications, depending on its specific purposes. An example of a recipe demonstrated for GaN-based structures by the inventors is as follows:

TABLE 1

| Gases | ICP power | RIE power | Pressure |
|---|---|---|---|
| 20 sccm Cl$_2$, 8 sccm BCl$_3$, 5 sccm Ar | 550 W | 65 W | 5 mTorr |

| Temperature | d.c. bias | Etch rate | Slope angle |
|---|---|---|---|
| 30° C. | −160 V | 2240 nm/min | 25° |

Under such conditions, the acceleration energy of the ions in the plasma is low, and the ions have little directionality. As a result, the sidewalls can be made to have an inclination of about 25° to the vertical, providing conformal metal coverage of features of up to 3 μm. An advantage of this particular recipe is its high etch rate.

Another etch recipe for GaN-based structures is:

TABLE 2

| Gases | ICP power | RIE power | Pressure |
|---|---|---|---|
| 20 sccm Cl$_2$, 8 sccm BCl$_3$, 5 sccm Ar | 650 W | 30 W | 5 mTorr |

| Temperature | d.c. Bias | Etch rate | Slope angle |
|---|---|---|---|
| 30° C. | −90 V | 767 nm/min | 40° |

These process conditions give sidewalls with a greater slope angle than provided using the process conditions of Table 1, although this is provided at the expense of a lower etch rate. In either case, the conditions are specifically selected and controlled to ensure that sloped sidewalls are defined.

In order to define the ridges 20 and trenches 22 of FIG. 1(b), it is preferred that the process conditions set out in Table 1 are used. A typical etch lasts approximately 15 min. Ridges 20 having a width in the range of 20-30 μm, for example 24 μm or 26 μm, and a separation in the range of 5-10 μm can be defined using this etch. As a specific example, sloped sidewall ridges 20 having a width of 24 μm and a separation of 6 μm have been fabricated using the conditions set out in Table 1, as have sloped sidewall ridges 20 having a width of 26 μm and a separation of 4 μm. The length of the ridges can vary depending on the desired pixel density, but is typically in the region of 480 to 2000 microns, where as a specific example 482 μm has been used for 16 by 16 arrays and 1992 μm has been used for 64 by 64 arrays. The pitch of the ridges is typically in the range 25-35 μm, and is preferably about 30 μm. All of these ridges have sidewalls that are inclined at substantially the same angle, so that the sidewall inclination is substantially uniform over the array.

Once the ridges 20 are defined, these are etched further to form a plurality of smaller, discrete pillars that are carried on the n-type GaN. These mesas all have sidewalls that are inclined at substantially the same angle. To do this, positive resist 21 is deposited on an upper surface of the ridges of FIG. 1(b). This is selectively exposed using lithographic techniques, such as photolithography. The resist is then developed, so that exposed areas are removed and the unexposed parts remain.

Figure 1C:
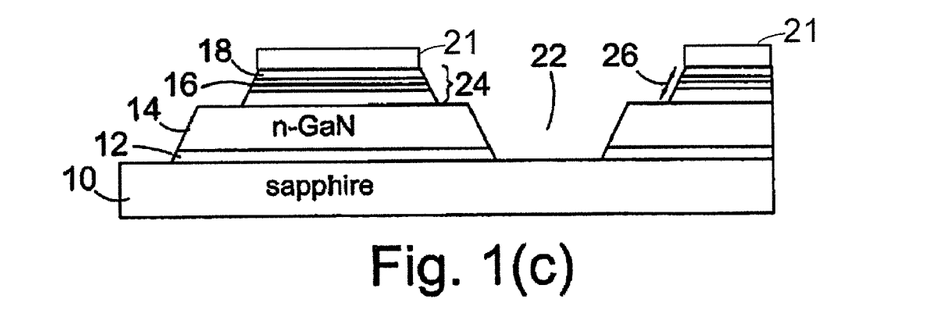
Figure 1D:
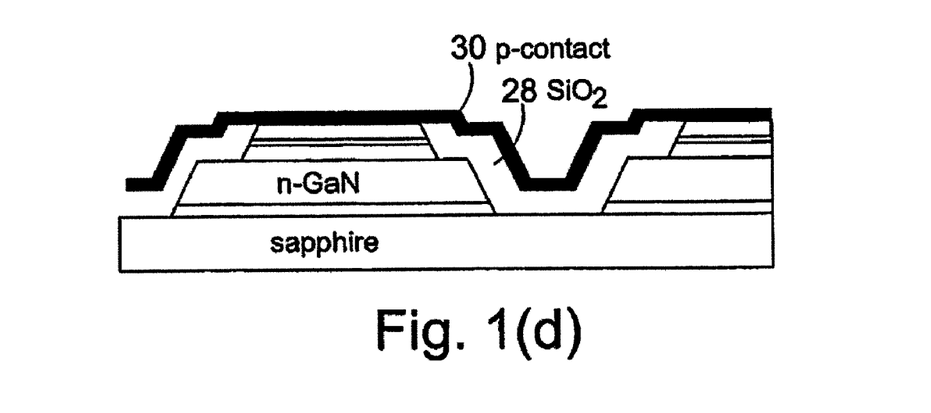
Figure 2:
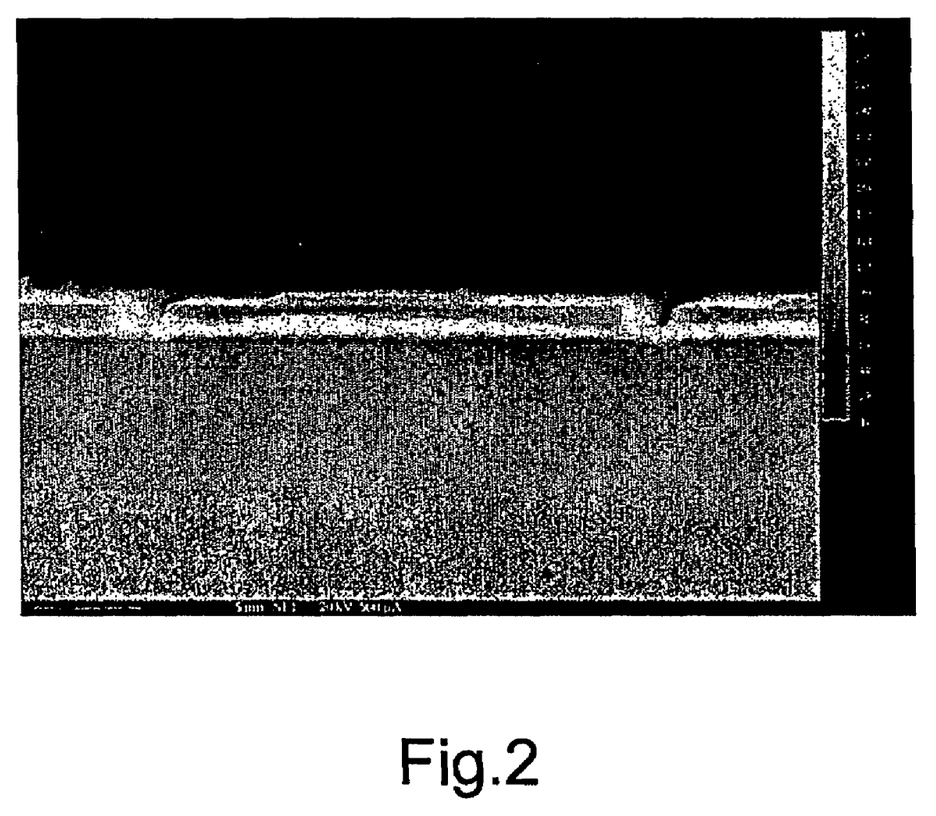
FIG. 2 is an image of a cross-section through an array of LED mesas made using the method of FIG. 1.

The shapes that are selectively exposed on the ridges 20 are, of course, a matter of choice. For example, it may be desired to form discrete pillars that have a circular cross-section. In this case, the resist would be exposed using a pattern that defines rows of circular openings along the top of the ridges 20, so that all of the resist is exposed, except selected circles. Once developed, a row of circular areas of resist is left on the top of the elongate ridges 20. A selective etch is then used to remove p-type material not covered by the resist and at least part of the n-type material of the ridges 20. As before, this etch is controlled so that the material left after has a sloped sidewall. This results in the formation on the top of each ridge 20 of a row pillars 24 that comprise the multi-quantum well active region 16 sandwiched between the n-type GaN 14 and p-type GaN 18, each pillar 24 having a substantially circular cross section and a sloped, substantially conically shaped sidewall 26. In the present example, the heights of the pillars are chosen to be approximately 0.5 μm because the thickness of the p-type GaN layer is 0.25 μm and it is necessary to etch through the p-GaN to expose the n-GaN to form a diode. Pillar diameters are typically 5-20 μm. FIG. 2 shows an image of any array formed using the method described with reference to FIGS. 1(a) to (c).

It should be noted that during this second etch stage, there is a degree of lateral dimension loss of the ridges 20. However, the second etch target is 0.5 μm in the vertical direction, and although an isotropic etch is used, the etch rate along the vertical direction is still much faster than in the horizontal direction. This means that the lateral dimension loss is not a particular problem for the device fabrication. Furthermore, there is a 2-3 μm process margin around the shapes that are to be selectively defined. Since the width of the ridges is typically 24-26 μm and the width of the pillars is 20 μm, this is enough to accommodate any, lateral dimension loss.

Once the pillars or mesas 24 are formed, the pillar sidewalls 26 are passivated to prevent shorting between the n and p-type regions once the array is metallised. To do this, the sidewalls 26 are coated with an insulating material, such as silicon dioxide. Because of this, a greater inclination angle to the vertical is desired. Hence, the conditions set out in Table 2 are most suitable for forming the pillars 24. It should be noted that the lower etch rates are acceptable since the etch depth is low. More specifically, to passivate the sidewalls, a thin layer of silicon dioxide 28 is deposited over the entire structure before removal of the resist that is on top of the mesas. It should be noted that this thin insulating layer conforms to the shape of the sloped wall mesas. The resist on the mesas is then removed. This causes lift-off of the silicon dioxide above them. After this, only the sidewalls 26 and regions between the mesas 24 are coated with the silicon dioxide 28 and the p-type tops of the mesas 24 are exposed.

Figure 3:
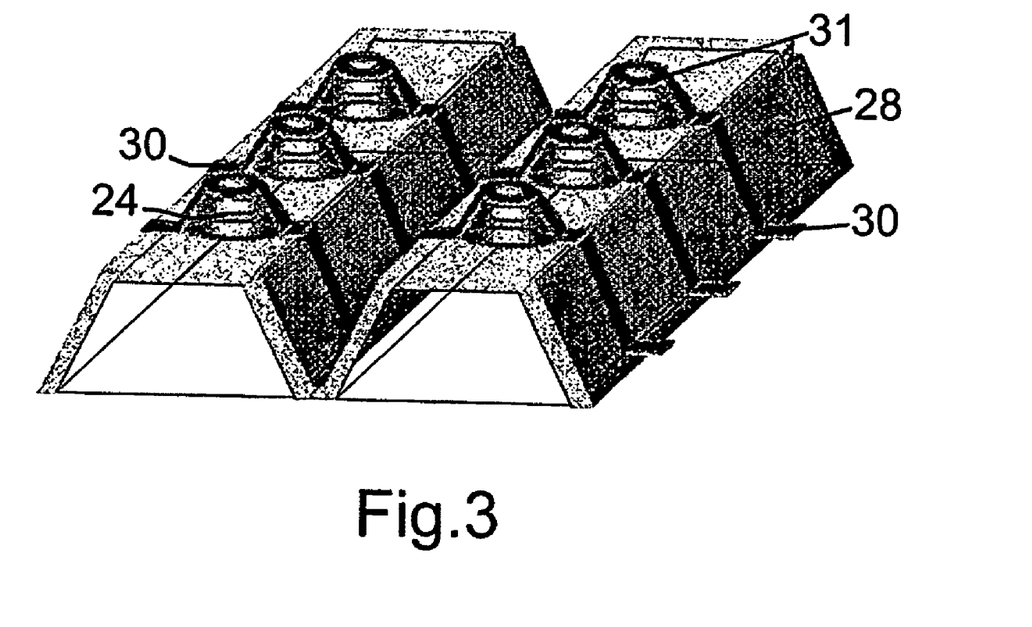
FIG. 3 is a diagrammatic view of an array of matrix addressable micro-LEDs formed by the sloped sidewall process.
Figure 4:
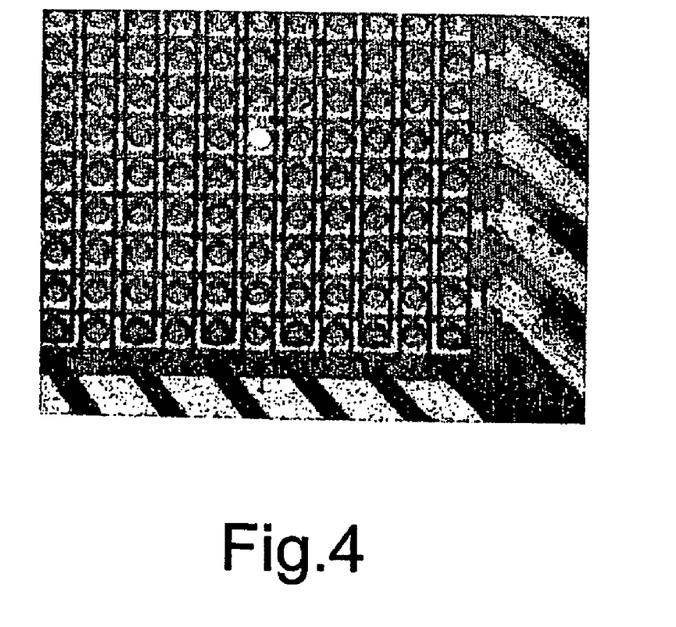
FIG. 4 is an optical microphotograph of a matrix addressable device, in which a single LED device is shown operating at 3.3V.

Once the tops of the mesas 24 are exposed, positive resist (not shown) is deposited over the entire surface, patterned and developed to define strips that extend in rows across the exposed tops of the mesas 24. The rows extend substantially perpendicular to the ridges 20 that carry the mesas 24. Along each strip, rings are defined. These rings are positioned so that each one is on top of one of the mesas 24. The device is then metallised. After the metal is deposited, the resist is dissolved, so that only strips of metal remain, these strips having rings formed periodically along their lengths. In this way, elongate metal contacts 30 are selectively deposited over rows of the mesas 24, so that the sloped, silicon dioxide coated sidewalls 26 and the exposed p-type contacts are covered with a conformal strip of metal, as shown in FIG. 3. In addition, a ring shaped metal contact 31 is formed on top of each mesa 24. Because of the silicon dioxide 26, adjacent metal contacts are electrically insulated from each other. An optical micrograph showing a view of a matrix addressable array made in accordance with the invention is shown in FIG. 4. In this, a single micro-LED element is shown operating at 3.3V.

It should be noted that although in the arrays of FIGS. 3 and 4, the elongate metal contacts 30 are narrow bands that cover a relatively narrow portion of the sidewalls of the mesas, they could be fabricated so that they cover substantially all of the sidewall of each mesa, so that the entire sidewall region of each mesa is enclosed within the contact. Provided this metal is sufficiently thick to prevent the transmission of light through it, an advantage of doing this is that the metal contact can then perform the dual function of providing a mechanism for making electrical contact to the electro-luminescent material, as well as acting as a shadow mask to reduce the emission of stray light from the sidewall. This substantially eliminates cross talk between adjacent devices. As an example, the sidewalls of the mesas could be clad with 300 nm or so of metal, in particular, 30 nm of nickel and 300 nm of gold. Of course, because of the ring shaped contacts 31 on the top of the mesas, light is still emitted through the upper surface of these.

By forming sloped sidewalls 26 for the semiconductor mesas 24, it is relatively easy to carry out the step of metallising the upper contacts of the array. Each of the metal strips extends over a plurality of LEDs and so, together with the ridges that define the n-type contacts, can be used to selectively stimulate individual LEDs. In this way, there is provided a relatively straightforward and repeatable method for fabricating an array of matrix addressable micro-LEDs.

Of course, whilst the LEDs of FIGS. 3 and 4 are individually addressable, the technique described with reference to FIG. 1 could be used to fabricate an array of micro-LEDs in which all of the device elements are connected together in a parallel-addressed format, i.e. where all of the elements are illuminated together. To form an array of this type, there is no need to define the trenches. As a result, the n-type regions remain interconnected, and only the step of defining the pillars is needed, as shown in FIGS. 5 (a) to (c).

Figure 5A:
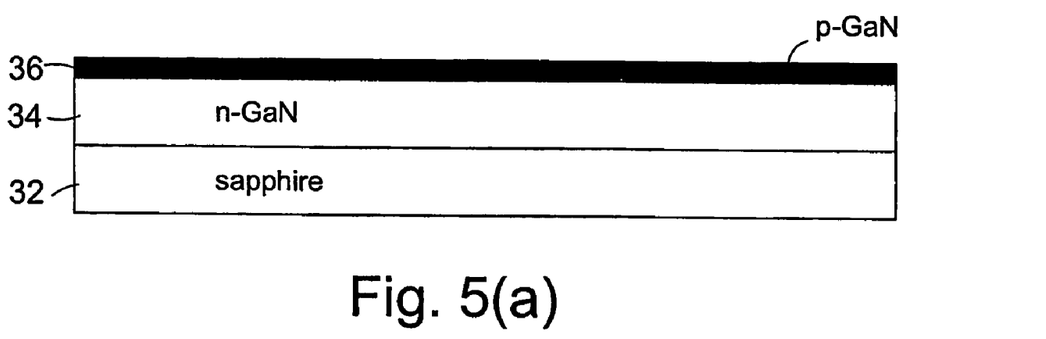
FIGS. 5(a) to (c) show various stages in a method for fabricating an array of parallel addressable micro-LEDs formed by the sloped sidewall process, the array being such that the parallel-addressed micro-LED elements are illuminated simultaneously.
Figure 5B:
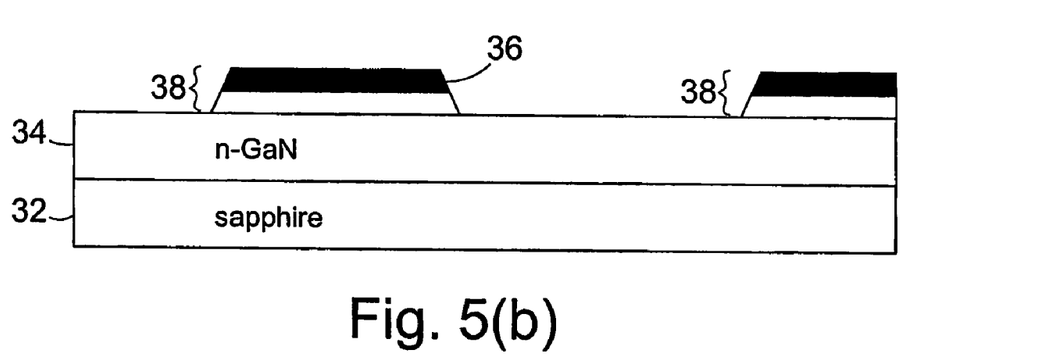

FIG. 5(a) shows a typical starting material. This is a sapphire substrate 32 carrying a layer of n-type GaN 34 on which is deposited a layer of p-type GaN 36. Alternatively, the starting material of FIG. 1 or any other suitable luminescent semiconductor material could equally be used. To form individual devices a layer of resist (not shown), preferably positive resist is patterned to define an array of substantially circular resist masks. The array could be in the form of rows and columns of circular masks as previously described or any other suitable layout. As for the matrix-addressable micro LEDs, the surface is then etched to define a plurality of mesas or pillars 38, see FIG. 5(b). As will be appreciated, the etch depth has to go below the level of the p-n junction to ensure that the devices include the active region. As before, adequate electrical isolation between the n-type material and the metal contact is critical, and so before deposition of a metal contact, a layer of silicon dioxide 40 is provided. Because of this, the pillars have to be fabricated to provide a relatively large inclination angle to the vertical. Hence, the process conditions set out in Table 2 are again adopted. Once this is done, the resist is removed from the tops of the mesas to lift off the silicon dioxide and thereby expose the mesa tops. Subsequently, a metal contact 42 is deposited to contact the p-type material of each of the mesas and allow electrical stimulation of the devices, as shown in FIG. 5(c). By applying a potential difference between the n-type GaN and the p-type metal contact of the array of FIG. 5(c), all of the LEDs in the array can be simultaneously stimulated. In this example, light is emitted through a top surface of the devices through the thin metal layer 42.

Figure 5C:
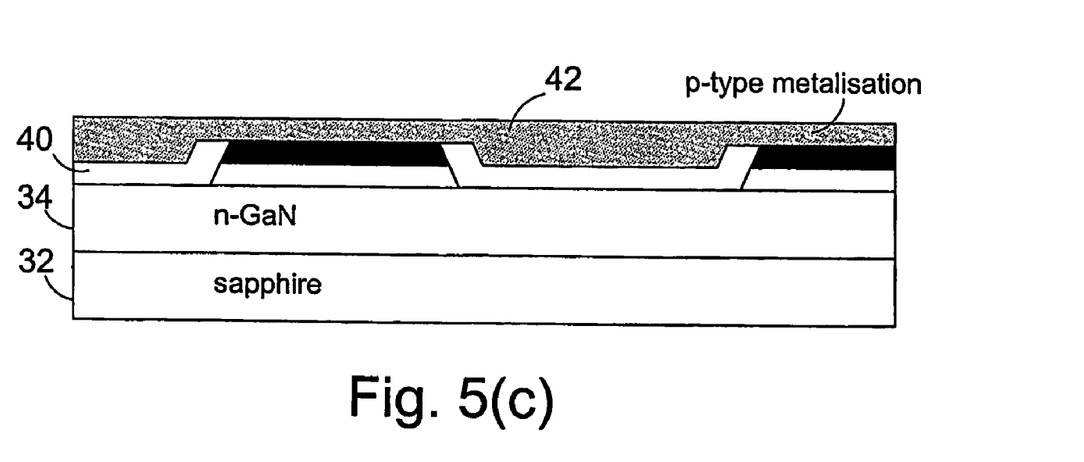
Figure 6:
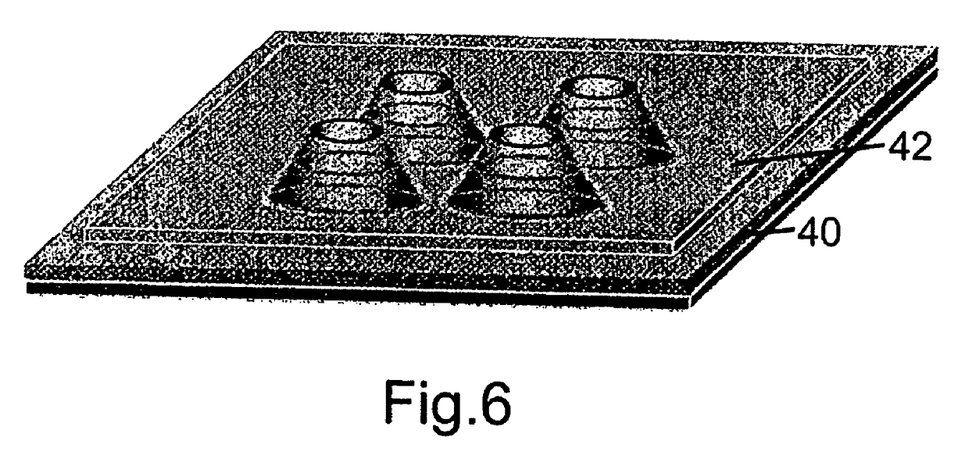
FIG. 6 is a perspective view of the array of FIG. 5(c)
Figure 7:
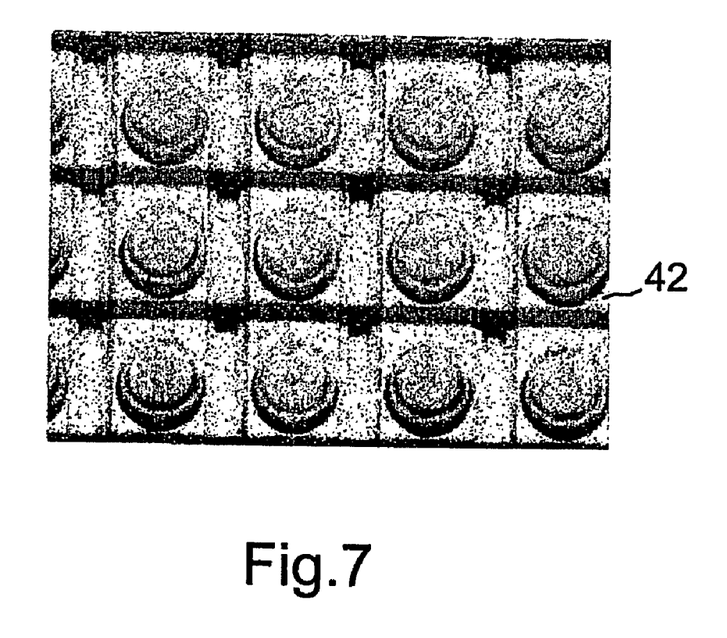
FIG. 7 is an optical microphotograph of the array of FIG. 6, showing conformal metal coverage.

In a variation of the array of FIG. 5(c), a shadow mask may be additionally defined to prevent light escaping from the sidewalls of the mesas. To do this, once the pillars are etched, and the silicon dioxide layer deposited, a relatively thick layer of one or more metals is deposited over the entire surface of the array. This layer should be thick enough to prevent light emitted from the mesas from being transmitted through it. As an example, the thick layer of metal may comprise 20 nm of nickel and 200 nm of gold. At this stage, the positive resist mask used for etching the mesas remains on top of those mesas. The combined thickness of the silicon dioxide layer and the thick metal layer should be less than the thickness of the resist that is on the top of the ridges. The resist on the p-type material is then removed, thereby exposing the tops of the pillars. After this is done another relatively thin spreading metal layer is deposited over all of the surface and in particular the exposed areas of p-type material. This layer should be thin enough to allow light to be transmitted through it, and may, for example, comprise 30 nm of Ni and 30 nm of gold. Once the thin metal layer is deposited, all of the pillars are electrically interconnected by the metal contact. FIG. 6 shows an example of this type of array and FIG. 7 shows an optical microphotograph of such an array. Conformal metal coverage over the sidewall is necessary.

By applying a potential difference between the n-type GaN and the p-type metal contact of the arrays of FIGS. 6 and 7, all of the LEDs in the array can be simultaneously stimulated. In this example, light is emitted through a top surface of the devices through the thin metal contact. Since the thick metal layer acts as a blocking layer for any light emission not coming vertically out of the top surface of the pillar, it eliminates "cross-talk" between elements in the array caused by scattering of light from the edges of the mesas.

Whilst the mechanism for contacting the sloped wall mesas described above involves forming metal contacts that conform to the shape of the mesas, a back filling and planarisation technique could also be used. This is not a preferred option, because, as described previously planarisation can cause damage to the upper parts of the mesas, particularly when p-type GaN forms the upper surface. Nevertheless, providing sloped wall mesas can improve the reliability of this technique. This is because a problem with planarisation techniques known in the art is that voids are often created in the material that is used to in-fill areas between mesas. When the in-filling is completed and the material is planarised, these voids can results in holes or cavities in the upper surface of the array. This in turn means that when the array is metallised, breaks in the contact may arise. Clearly this can cause difficulties. However, by using sloped sidewall mesas, the in-filling process is more effective, so reducing the number of voids that are formed. This means that after metallisation, contact uniformity is improved.

A skilled person will appreciate that variations of the disclosed arrangements are possible without departing from the invention. For example, whilst in the specific embodiment described with reference to FIGS. 1 to 7 the lower contact is n-type material and the upper contact is p-type material, it will be appreciated that layers of the device could be swapped round, so that the lower contact is p-type and the upper contact is n-type. It is also possible for both contacts to be n-type. This would be the case if an intracavity tunnel junction structure were used, the structure being of the type disclosed in, for example, "Lateral current spreading in GaN-based light-emitting diodes utilising tunnel junction contacts", by S.-R. Jeon et al., Applied Physics Letters, Vol. 78, No. 21, pp. 3265-3267, May 2001.

Figure 8:
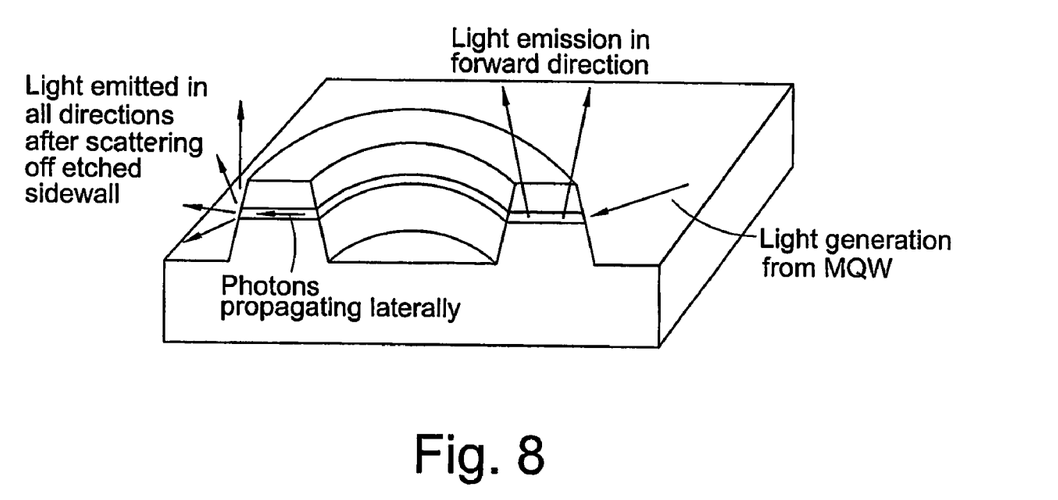
FIG. 8 is a perspective view of a ring shaped LED in which the invention is embodied.

In addition, although the active devices of the specific embodiment have a substantially circular cross-section, other device geometries could be used. For example, the devices could be ring shaped, as shown schematically in FIG. 8. To form these, the inner wall of the ring could be defined either after processing of the sloped sidewalls mesas or at the same time as the outer, sloped wall. In this latter case, the resist masks used to define the mesas would be ring shaped rather than circular, and both of the inner and outer walls that define the ring would be formed simultaneously and so would be sloped. In this example, in order to isolate the n- and p-type regions within the ring the self aligned oxidation process described previously is used. More specifically, before removing the ring-shaped mask a thin layer of silica is formed. The mask is subsequently removed to expose the ring-shaped top of the p-type material. This is subsequently metallised using one or more layers of metal. Typically, the metal is no thicker than about 30 nm. Since the rings are, for example, of the order of 700 nm, this means that the metal coats the array and generally conforms to the shape of its upper surface. Where processing is done after formation of the mesas, subsequent process steps would have to be carried, out to remove material from the interior of the mesas, thereby to define a ring. However, since this introduces additional processing steps, the former technique is preferred.

Ring shaped micro-LEDs provide various advantages, such as improved extraction efficiency. This is because they have a relatively large surface area to volume ratio, a minimum optical path length and a plurality of extraction routes and surfaces. It is envisaged that the ring shaped devices may be useful for many different applications. As an example, the holes defined by the rings may act as wells or receptacles for material that is to be optically tested. Because the ring shaped devices in accordance with the invention can be made very small, this means that the test sample sizes can be correspondingly small. This is convenient for some applications, and in particular applications in the field of bio-technology. Alternatively or additionally material could be placed in the wells to change the optical output of the devices. For example specific phosphors and/or polymers may be put in some of the wells so that the optical output of part of or all of the array is different from that of the intrinsic output that would be provided in the absence of the in-fill material. Other examples of materials that could be placed in the wells include microspheres, such as ball microlenses for directing the output beam or latex microspheres with attached chemicals for selective excitation. Accordingly, the above description of a specific embodiment is made by way of example only and not for the purposes of limitation. It will be clear to the skilled person that minor modifications may be made without significant changes to the operation described.

The invention claimed is:

1. A method of fabricating an array of light emitting devices using a luminescent semiconductor material, preferably an electro-luminescent semiconductor material, the method comprising:
    defining a plurality of resist masks on the semiconductor material;
    defining a plurality of sloped-wall mesas by removing material around the resist masks, each of the sloped-wall mesas forming a light-emitting device;
    depositing an insulating layer over the surface of the material including the sloped-wall mesas and the resist masks so that the insulating layer conforms to the shape of the mesas;
    removing the resist masks to expose the tops of the mesas, and
    depositing an electrical contact over the tops of the mesas, the electrical contact conforming to the shape of the mesas.

2. A method as claimed in claim 1 comprising defining the sloped-wall mesas by controlling a dry etch process.

3. A method as claimed in claim 1, wherein each sloped wall mesa is an LED or a VCSEL.

4. A method as claimed in claim 1, wherein the sidewalls of each individual mesa have an inclination of between 20°-40° to the vertical.

5. A method as claimed in claim 1 comprising defining one or more ridges in the semiconductor material, the or each ridge having a sloped sidewall and forming the sloped sidewall mesas on one or more of the ridges.

6. A method as claimed in claim 5, wherein the sidewall of each individual mesa has an inclination of between 20°-40° to the vertical.

7. A method as claimed in claim 5, wherein the inclination of the sidewall of any given or all of the mesas is greater than the inclination of the sloped sidewall of the ridge on which it is defined.

8. A method as claimed in claim 5, wherein the or each ridge defines a lower electrical contact.

9. A method as claimed in claim 1, wherein the conformal electrical contact extends over all of the mesas in the array.

10. A method as claimed in claim 9 when dependent on any of claims 5 to 7, wherein a plurality of mesa carrying ridges is provided and the conformal electrical contact contacts one mesa on each of the plurality of ridges.

11. A method as claimed in claim 10, wherein the ridges and the upper contact are substantially elongate and the upper contact extends substantially perpendicular to the ridges.

12. A method as claimed in claim 1, wherein the semiconductor material is at least one of a semiconductor based on the III-V semiconductor alloy materials system AlGaInN, deposited as a multi-layer epitaxial thin film structure on a substrate; a semiconductor material that comprises a layer of n-type material and a layer of p-type material, with an active region between them, the active region preferably being a multi-quantum well.

13. A method as claimed in claim 1 comprising defining a well or hole in at least one of the mesas, preferably wherein one or more of the sloped wall mesas is substantially ring shaped.

* * * * *

UNITED STATES PATENT AND TRADEMARK OFFICE
CERTIFICATE OF CORRECTION

PATENT NO. : 7,598,149 B2
APPLICATION NO. : 10/544002
DATED : October 6, 2009
INVENTOR(S) : Dawson et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 534 days.

Signed and Sealed this

Twenty-eighth Day of September, 2010

David J. Kappos
*Director of the United States Patent and Trademark Office*